United States Patent
Sankin et al.

(10) Patent No.: US 7,470,967 B2
(45) Date of Patent: Dec. 30, 2008

(54) SELF-ALIGNED SILICON CARBIDE SEMICONDUCTOR DEVICES AND METHODS OF MAKING THE SAME

(75) Inventors: Igor Sankin, Starkville, MS (US);
Janna B. Casady, Starkville, MS (US);
Joseph N. Merrett, Starkville, MS (US)

(73) Assignee: SemiSouth Laboratories, Inc., Starkville, MS (US)

( * ) Notice: Subject to any disclaimer, the term of this patent is extended or adjusted under 35 U.S.C. 154(b) by 0 days.

(21) Appl. No.: 11/076,857

(22) Filed: Mar. 11, 2005

(65) Prior Publication Data

US 2005/0199882 A1   Sep. 15, 2005

Related U.S. Application Data

(60) Provisional application No. 60/552,398, filed on Mar. 12, 2004.

(51) Int. Cl.
| H01L 27/095 | (2006.01) |
| H01L 29/47 | (2006.01) |
| H01L 29/812 | (2006.01) |
| H01L 31/07 | (2006.01) |
| H01L 31/108 | (2006.01) |

(52) U.S. Cl. ............................. 257/471; 257/E29.148; 257/E29.265; 257/77

(58) Field of Classification Search .......... 257/E29.148, 257/E29.149, E29.265, E29.32, 77, 280, 257/284, 472, 471
See application file for complete search history.

(56) References Cited

U.S. PATENT DOCUMENTS 5,270,554 A   12/1993   Palmour (Continued)

FOREIGN PATENT DOCUMENTS

JP    10209435    *   8/1998

(Continued)

OTHER PUBLICATIONS

R.C. Clarke and John W. Palmour. "SiC Microwave Power Technologies", *Proceedings of the IEEE*, vol. 90, No. 6 (Jun. 2002), pp. 987-992.

(Continued)

*Primary Examiner*—Monica Lewis
(74) *Attorney, Agent, or Firm*—Morris, Manning & Martin, LLP; Christopher W. Raimund

(57) ABSTRACT

A self-aligned silicon carbide power MESFET with improved current stability and a method of making the device are described. The device, which includes raised source and drain regions separated by a gate recess, has improved current stability as a result of reduced surface trapping effects even at low gate biases. The device can be made using a self-aligned process in which a substrate comprising an $n^+$-doped SiC layer on an n-doped SiC channel layer is etched to define raised source and drain regions (e.g., raised fingers) using a metal etch mask. The metal etch mask is then annealed to form source and drain ohmic contacts. A single- or multilayer dielectric film is then grown or deposited and anisotropically etched. A Schottky contact layer and a final metal layer are subsequently deposited using evaporation or another anisotropic deposition technique followed by an optional isotropic etch of dielectric layer or layers.

13 Claims, 6 Drawing Sheets

U.S. PATENT DOCUMENTS

| | | | |
|---|---|---|---|
| 5,459,089 A | 10/1995 | Baliga | |
| 5,543,637 A | 8/1996 | Baliga | |
| 5,686,737 A | 11/1997 | Allen | 257/77 |
| 5,895,939 A | 4/1999 | Ueno | |
| 5,925,895 A | 7/1999 | Sriram et al. | 257/77 |
| 6,159,781 A | 12/2000 | Pan et al. | 438/167 |
| 6,686,616 B1 * | 2/2004 | Allen et al. | 257/280 |
| 6,906,350 B2 * | 6/2005 | Sriram | 257/77 |
| 2002/0149021 A1 | 10/2002 | Casady et al. | 257/77 |
| 2003/0075719 A1 * | 4/2003 | Sriram | 257/77 |

FOREIGN PATENT DOCUMENTS

| | | | |
|---|---|---|---|
| WO | WO 98/35389 | * | 8/1998 |

OTHER PUBLICATIONS

Kazushige Horio, Yasuji Fuseya, Hiroyuki Kusuki, and Hisayoshi Yanai. "Numerical Simulation of GaAs MESFET's with a p-Buffer Layer on the Semi-Insulating Substrate Compensated by Deep Traps", *IEEE Transactions on Microwave Theory and Techniques*, vol. 37, No. 9 (Sep. 1989), pp. 1371-1379.

N. Sghaier, J.M. Bluet, A. Souifi, G. Guillot, E. Morvan, and C. Brylinski. "Influence of Semi-Insulating Substrate Purity on the Output Characteristics of 4H-SiC MESFETs", *Materials Science Forum*, vols. 389-393 (2002), pp. 1363-1366.

G.Y. Chung, C.C. Tin, J.R. Williams, K. McDonald, R.K. Chanana, Robert A. Weller, S.T. Pantelides, Leonard C. Feldman, O.W. Holland, M.K. Das, and John W. Palmour. "Improved Inversion Channel Mobility for 4H-SiC MOSFETs Following High Temperature Anneals in Nitric Oxide", *IEEE Electron Device Letters*, vol. 22, No. 4 (Apr. 2001), pp. 176-178.

Ho-Young Cha, C.I. Thomas, G. Koley, Lester F. Eastman, and Michael G. Spencer. "Reduced Trapping Effects and Improved Electrical Performance in buried-gate 4H-SiC MESFETs", *IEEE Transactions on Electron Devices*, vol. 50, No. 7 (Jul. 2003), pp. 1569-1574.

* cited by examiner

US 7,470,967 B2

SELF-ALIGNED SILICON CARBIDE SEMICONDUCTOR DEVICES AND METHODS OF MAKING THE SAME

This application claims priority from U.S. Provisional Application Ser. No. 60/552,398, filed Mar. 12, 2004. The entirety of that provisional application is incorporated herein by reference.

BACKGROUND

1. Technical Field

The present application relates generally to semiconductor devices and, in particular, to self-aligned silicon carbide power MESFETs and to a method of making the same.

2. Background of the Technology

Silicon Carbide Metal-Semiconductor-Field-Effect-Transistors (i.e., MESFETs) have attracted a tremendous attention of developers as ideal devices for high power continuous-wave (CW) high-frequency (S and X band) linear wide bandwidth monolithic microwave integrated circuits (MMICs) [1].

Significant successes have been achieved in the development of power SiC MESFET devices in the past decade. However, certain issues with these devices remain to be solved. In particular, one of the major problems preventing wide commercialization of power SiC MESFETs is current instability due to trapping effects.

Trapping effects occur when electrons get trapped by acceptor-like levels either in the semi-insulating (SI) substrate (a phenomenon which is commonly referred to as "backgating") or at the surface (i.e., surface trapping).

The use of a p-type buffer layer to separate the channel from the substrate has been shown to reduce backgating [2]. The use of recently introduced high-purity semi-insulating substrates has also been reported to significantly minimize current instabilities caused by backgating effects [3].

There are several ways to reduce surface trapping effects. First, various techniques may be employed to passivate interface states. However, even after advanced passivation, the interface state density remains in the $10^{12}$ range [4].

An alternative approach is to use device structures that minimize the influence of interface traps on current stability by distancing the main current stream away from the surface. Encouraging results have been reported in work where devices with different structures were compared in terms of current stability [5].

There still exists a need for power SiC MESFETs having greater current stability.

SUMMARY

According to a first aspect of the invention, a method of making a semiconductor device is provided which comprises:

selectively etching a first layer of n-type SiC on a second layer of n-type SiC using a metal etch mask on the first layer of n-type SiC, wherein the second layer of n-type SiC is less heavily doped with an n-type dopant than the first layer of n-type SiC, wherein the second layer of n-type SiC is on a layer of p-type SiC which is on a SiC substrate layer, and wherein etching comprises etching through the first layer of n-type SiC and into the second layer of n-type SiC to form a plurality of discrete raised regions each having an upper surface, the plurality of discrete raised regions being spaced from one another thereby defining one or more recesses between adjacent raised regions, the one or more recesses having a bottom surface and sidewalls;

annealing the metal etch mask on the first layer of n-type SiC to form ohmic contacts on upper surfaces of the raised regions;

depositing one or more layers of dielectric material on exposed surfaces of the first and second layers of n-type SiC including the bottom surface and sidewalls of the one or more recesses;

anisotropically etching through the one or more dielectric layers on the bottom of the one or more recesses to expose second layer of n-type SiC; and depositing a Schottky metal on the exposed second layer of n-type SiC in the one or more recesses to form a gate junction. According to this aspect, an n-type SiC layer which is more heavily doped with an n-type dopant than the second n-type SiC layer can be positioned between the second n-type SiC layer and the p-type buffer layer. Depositing one or more layers of dielectric material may comprise depositing a layer of $SiO_2$ on exposed surfaces of the first and second layers of n-type SiC. Depositing one or more layers of dielectric material may also comprise depositing a layer of $Si_3N_4$ and subsequently depositing a layer of $SiO_2$ on exposed surfaces of the first and second layers of n-type SiC. The metal etch mask may comprise nickel or aluminum.

According to a second aspect of the invention, a semiconductor device made by a method as set forth above is provided.

According to a third aspect of the invention, a semiconductor device is provided which comprises:

a SiC substrate layer;

a buffer layer of a p-type SiC on the SiC substrate layer;

a channel layer of n-type SiC on the buffer layer, the channel layer comprising a plurality of raised regions in spaced relation, the raised regions having an upper surface and defining one or more recesses having a bottom surface and sidewalls between adjacent raised regions;

a source/drain layer of n-type SiC on the upper surfaces of the raised regions of the channel layer, wherein the source/drain layer is more heavily doped with an n-type dopant than the channel layer;

metal contacts on the source/drain layer of n-type SiC;

a gate region of a Schottky metal on the bottom surface of at least one recess; and one or more layers of a dielectric material on the sidewalls of the one or more recesses;

wherein the gate region forms a rectifying junction with the channel layer and wherein the gate region is aligned between the sidewalls of the recess. According to one embodiment, the gate region can be in contact with the one or more dielectric layers on the sidewalls of the recess. Alternatively, the gate region can be spaced from the one or more dielectric layers on the sidewalls of the recess. The semiconductor device may further comprise an n-type SiC layer which is more heavily doped with an n-type dopant than the channel layer positioned between the p-type buffer layer and the channel layer.

DETAILED DESCRIPTION

Figure 1:
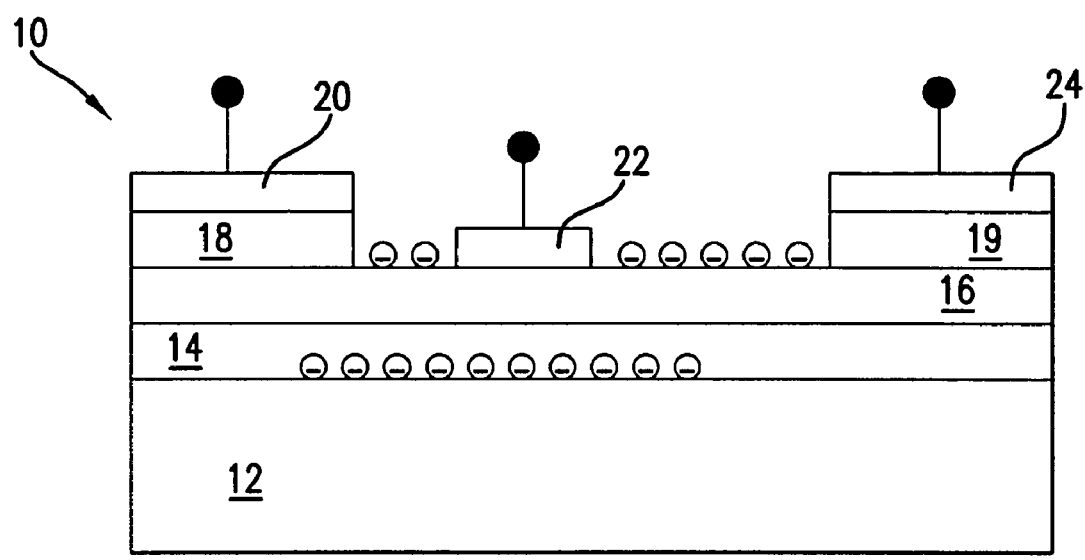
FIG. 1 is a schematic cross-section of a SiC power MESFET.

As set forth above, trapping effects occur in MESFET devices when electrons get trapped by acceptor-like levels either in the semi-insulating (SI) substrate (which is commonly referred to as "backgating") or at the surface. FIG. 1 shows a schematic cross-section of a SiC MESFET 10 fabricated on a semi-insulating substrate 12 with a p-type buffer layer 14. As can be seen from FIG. 1, the SiC MESFET 10 also comprises an n-type channel layer 16, an n-type source region 18, an n-type drain region 19, and source 20, gate 22 and drain 24 contacts. In FIG. 1, the regions where electrons can be trapped by acceptor states are indicated in the drawing by minus signs.

As set forth above, various device structures have been developed that attempt to minimize the influence of interface traps on current stability by distancing the main current stream away from the surface. For example, current stability can be improved by utilizing gate-recessed or buried gate structures. However, even gate-recessed and buried gate structures cannot prevent instability of the drain current at low gate biases, when electrons flow in close vicinity to the surface.

A self-aligned power SiC MESFET structure with improved current stability is described herein. In this device, the influence of an electron charge trapped at the surface on the output characteristics is negligible compared to conventional MESFET structures. The device can be made using a very simple and economical fabrication process based on self-aligned technology.

Figure 2A:
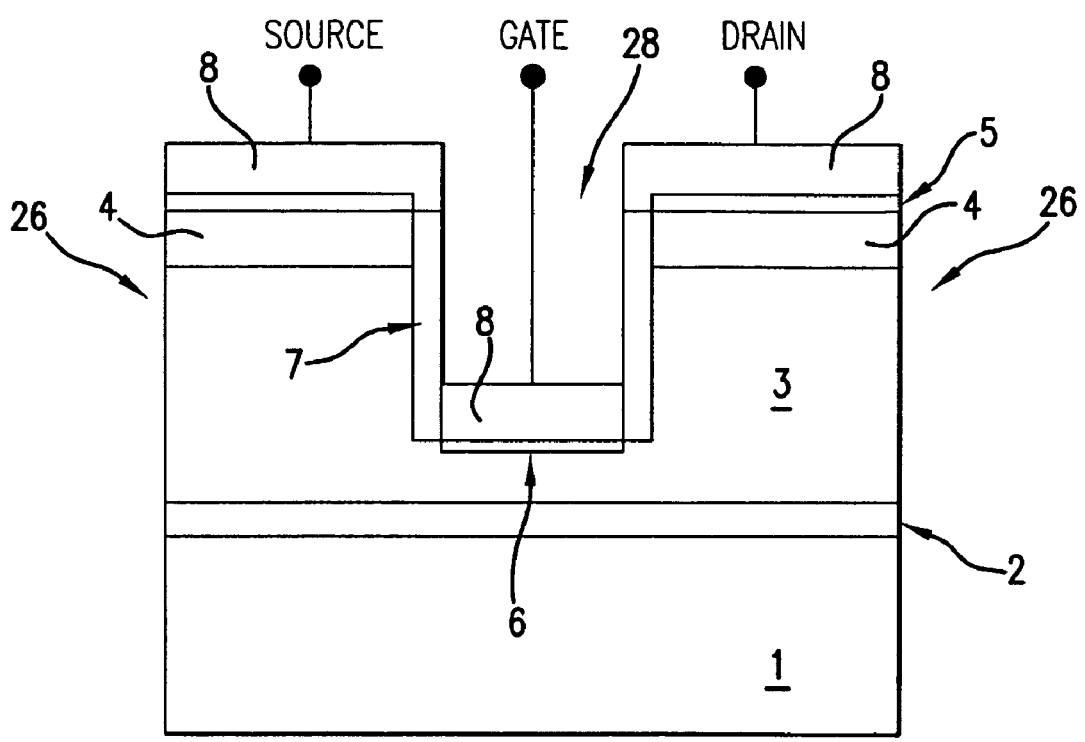
FIG. 2A is a schematic cross-section of a self-aligned SiC power MESFET according to a first embodiment.

FIG. 2A shows a schematic cross-section of a self-aligned power SiC MESFET structure according to a first embodiment. As shown in FIG. 2A, the device comprises a semi-insulating substrate 1, a p-type SiC buffer layer 2, an n-type SiC channel 3, source and drain fingers 26 formed in the channel and separated by a gate recess 28, and n+ source and n+ drain layers 4. The device as shown in FIG. 2A also includes source and drain ohmic contacts 5 and a Schottky contact 6. Also shown are source, drain and gate contacts 8 formed via self-aligned metallization. As also shown in FIG. 2A, the device structure includes a surface passivation layer 7.

Figure 2B:
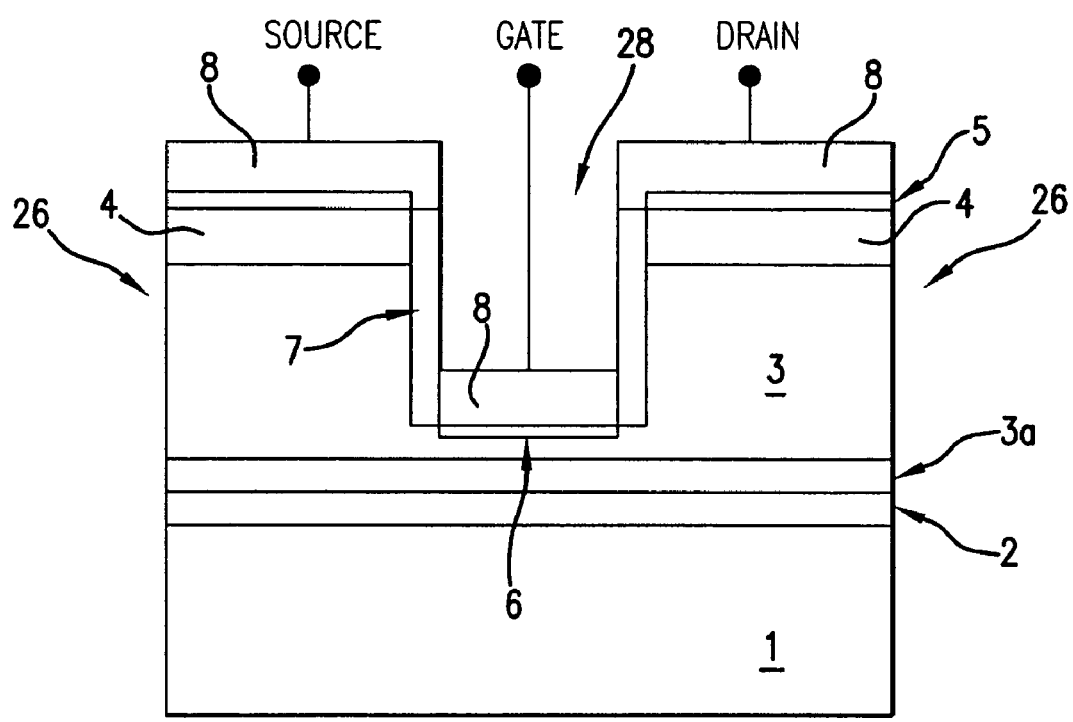
FIG. 2B is a schematic cross-section of a self-aligned SiC power MESFET according to a second embodiment.

FIG. 2B shows a schematic cross-section of a self-aligned power SiC MESFET structure according to a second embodiment. The device shown in FIG. 2B is similar in structure to the device shown in FIG. 2A. This device, however, also includes an optional n-type layer 3a.

The devices shown in FIGS. 2A and 2B include a surface passivation layer 7. However, even under conditions where the surface trap density is high, the influence of the electron charge trapped at the surface on the drain current is virtually eliminated. A two dimensional (2-D) numerical analysis conducted on a device having a structure as shown in FIG. 2A revealed that current does not flow in close vicinity to the surface in the source-to-gate and gate-to-drain segments. Rather, current flow in these segments of the device is shown to occur in the bulk material of the source and drain fingers.

Exemplary doping concentrations and thickness for the layers of the device shown in FIG. 2 are set forth below:

| # | Material | Thickness (μm) | Doping Conc. (cm$^{-3}$) |
|---|---|---|---|
| 2 | Epitaxially grown layer (p-type) | 0.1-10 | $1 \times 10^{15}$-$3 \times 10^{17}$ |
| 3 | Epitaxially grown layer (n-type) | 1-5 | $1 \times 10^{15}$-$1 \times 10^{17}$ |
| 3a | Epitaxially grown layer (n-type) | 0.1-0.5 | $5 \times 10^{16}$-$3 \times 10^{17}$ |
| 4 | Epitaxially grown layer (n-type) | 0.2-1.5 | $>5 \times 10^{18}$ |

Figure 3:
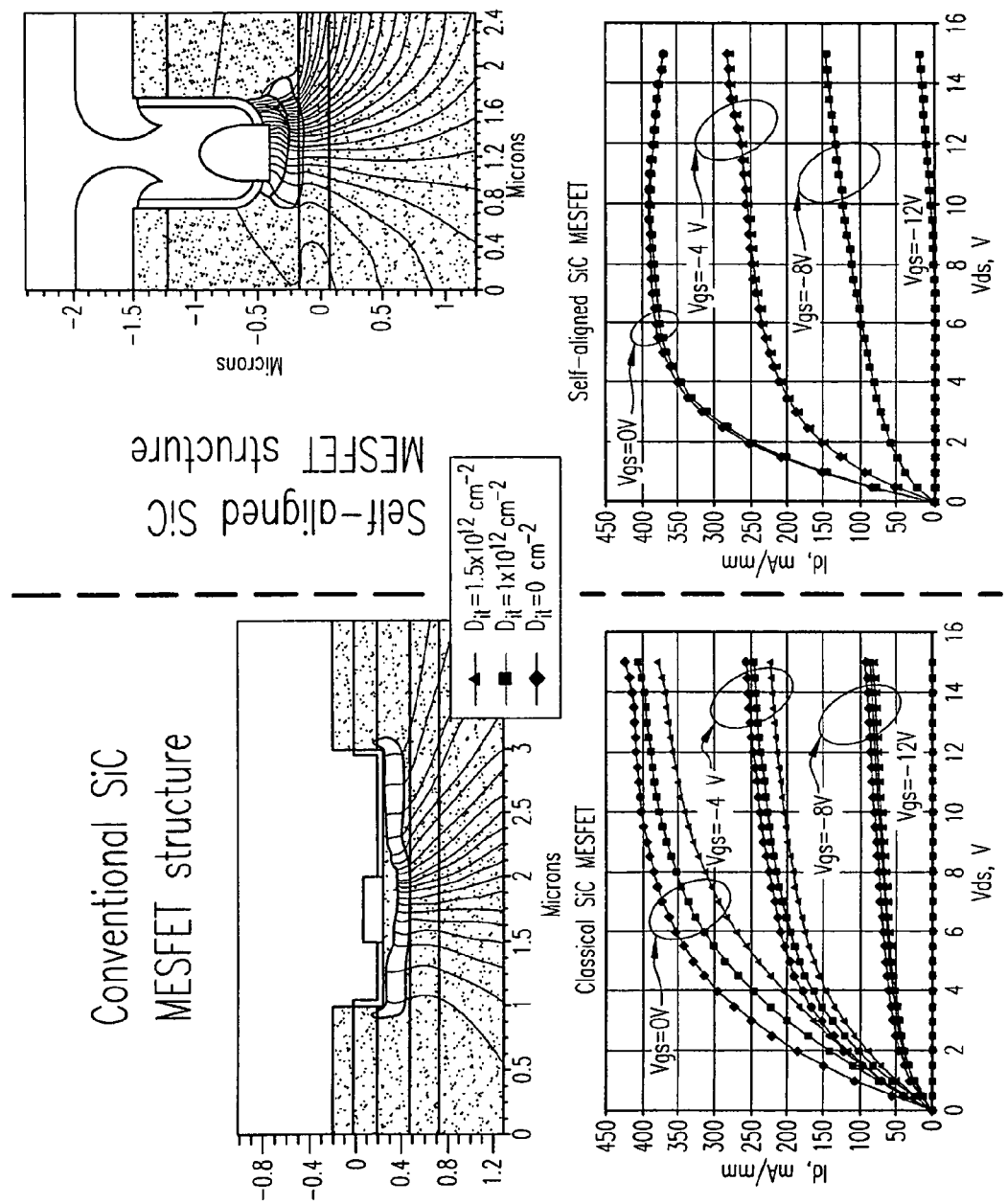
FIG. 3 is a comparison of the current flow and DC IV characteristics of a conventional (left) and a self-aligned (right) SiC power MESFET.

FIG. 3 shows a comparison of current flows in a conventional device and in a self-aligned device as described herein. In particular, FIG. 3 is a comparison of the current flow and DC I-V characteristics of a conventional (left figure) and a self-aligned (right figure) 4H—SiC power MESFET structures on semi-insulating substrates with p-type buffer layers. The distribution of current density is simulated at zero gate bias and zero interface trap density (on the top), and I-V characteristics have been simulated for the different interface trap densities (on the bottom). The simulation was performed using a Silvaco Atlas™ 2-D device simulator for the different values of interface trap density ($D_{it}$). In the simulation shown in FIG. 3, the conventional and self-aligned MESFETs have the same thickness and doping concentration for the channel and buffer layers.

Figure 4:
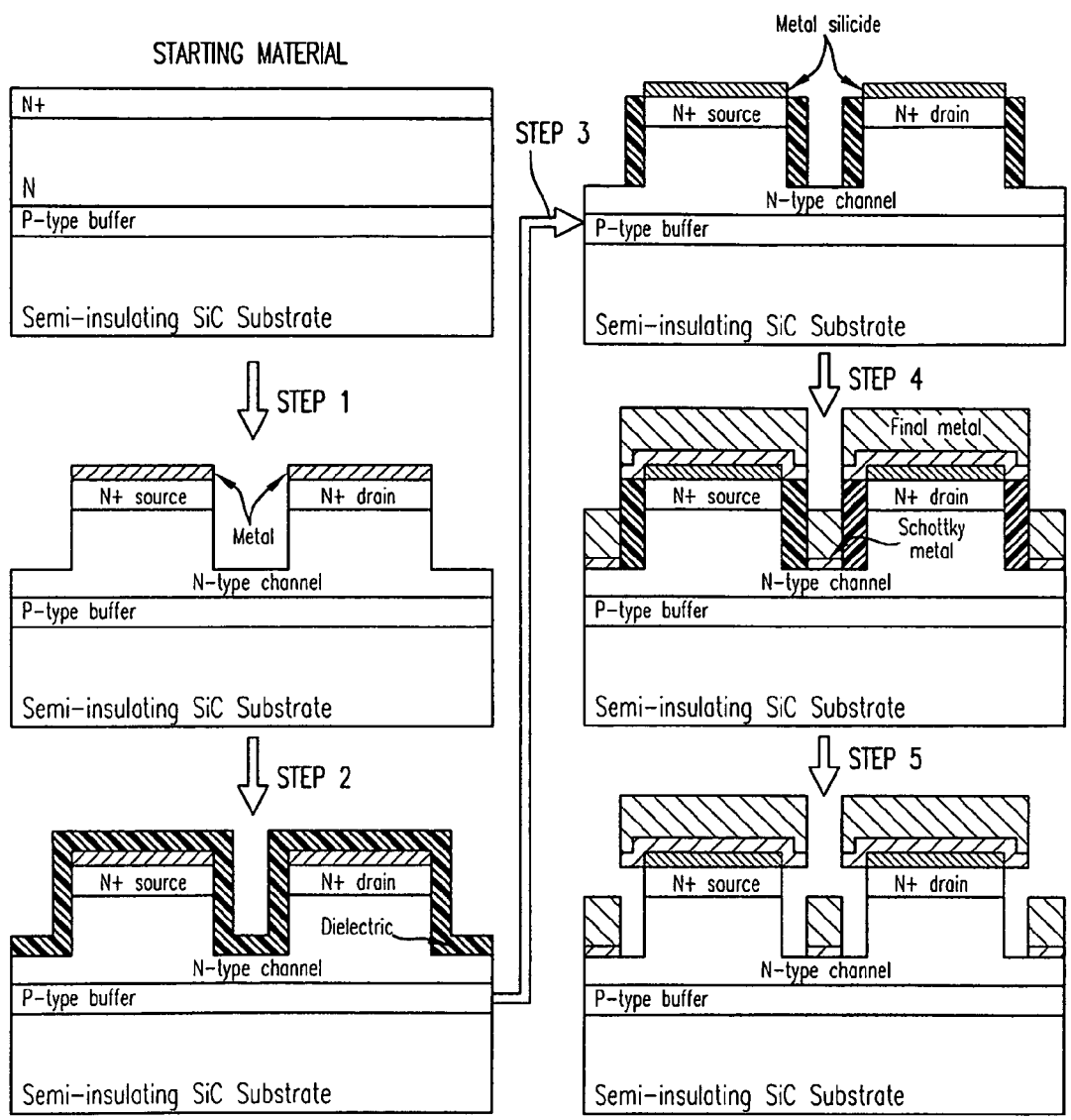
FIG. 4 is a schematic process flow for the fabrication of a self-aligned SiC MESFET.

As set forth above, the gate of a power SiC MESFET can be formed using a self-aligned process. A schematic process flow for self-aligned SiC MESFET fabrication is shown in FIG. 4. This diagram shows only the self-aligned process, and does not include, for example, the device mesa isolation and air-bridge formation process flow for the fabrication of the self-aligned SiC MESFET.

The process illustrated in FIG. 4 comprises the following steps:

Step 1: Source and Drain finger definition.

Step 2: Single- or multilayer dielectric film growth or deposition.

Step 3: Anisotropic plasma etching through the dielectric layers and source/drain ohmic contact anneal.

Step 4: Deposition of Schottky contact and final metal using evaporation or other anisotropic deposition technique.

Step 5: Isotropic etch of dielectric layer or layers (optional). Device mesa isolation and air-bridge formation can be performed using known methods.

Figure 5:
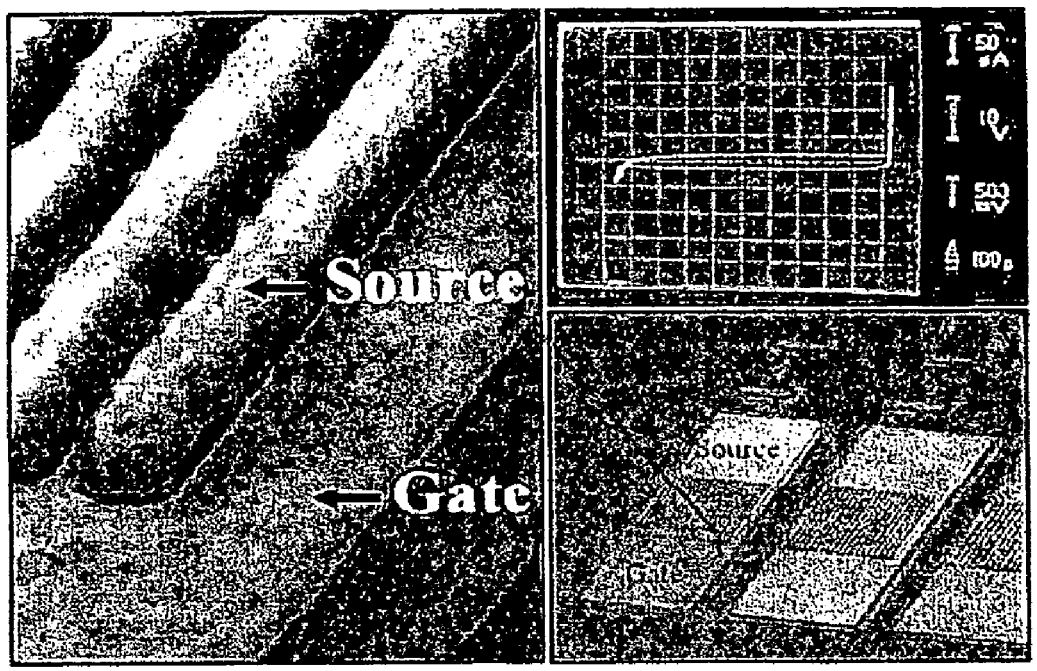
FIG. 5 includes SEM photographs of the test structures used for the development of the self-aligned gate metallization process (left and bottom-right) as well as a curve-tracer screen showing a source-to-gate I-V curve (right-top corner).

FIG. 5 illustrates the results of using a gate metallization process that allows for self-aligned metal (e.g., gold) deposition. In this process, the gate thickness is limited only by the trench depth. An SEM picture of test structures used for the development of the self-aligned process is shown in the right-bottom corner of FIG. 5. These structures that had a gate periphery of 20×50 μm, and source/gate line widths varying from 1 μm to 2 μm, and have received source/gate Au metallization at a thickness of 5 kÅ. A close-up SEM picture of the test structure with source/gate line widths of 1 μm/1 μm is shown on the left side of FIG. 5. For the proposed self-aligned MESFET structure, the source- to-gate breakdown voltage is related to the depth of the gate recess and can be adjusted within a wide range.

Unlike many other so called "self-aligned" MESFET-related processes (e.g., [6, 7]), the self-aligned process described herein is truly self-aligned because it excludes all critical alignment steps from the device fabrication. For example, structures with a 0.4 μm wide, 5 kÅ thick gate metal lines similar to the device depicted in FIG. 5 have been made using a Karl Suss MJB-3 contact aligner.

The gate metallization technology described can be used for the self-aligned gate or base metal formation of vertical power switching or RF devices such as VJFETs, SITs, and BJTs. This technology can be also used in the fabrication of lateral devices with submicron gate length such as power SiC MESFETs.

Although exemplary embodiments are shown in FIGS. 2A-2B and 4, other alternatives to the are possible. For example, GaN epitaxial layers (n and p-type) can be grown on silicon carbide, sapphire, or silicon substrates to form a starting material stack for the fabrication of the device. Alternatively, a substrate material comprising a conducting SiC substrate (either of n-type or p-type) can be used. Another exemplary substrate material that can be used is a conducting SiC substrate with a semi-insulating epitaxially grown buffer layer as set forth, for example, in Casady et al., "Silicon carbide and Related Wide-Bandgap Transistors on Semi-Insulating Epitaxy for High-Speed, High-Power Applications," U.S. Patent Application Publication No. 2002/0149021-A1, published Oct. 17, 2002. Alternatively, different types of ceramics with high thermal conductivity can be used as a substrate material (e.g., AlN, $Al_2O_3$, BeO, etc.).

Silicon carbide crystallizes in numerous (more than 200) different modifications (polylypes). The most important are: 3C—SiC (cubic unit cell, zincblende); 2H—SiC; 4H—SiC; 6H—SiC (hexagonal unit cell, wurtzile); 15R—SiC (rhombohedral unit cell). The 4H polytype is more attractive for power devices, however, because of its higher electron mobility. Although the 4H—SiC is preferred, it is to be understood that the present invention is applicable to self-aligned power SiC MESFETs described herein made of other wide bandgap semiconductor materials such as gallium nitride, indium phosphate and other polytypes of silicon carbide, by way of example.

The SiC layers of the self-aligned structure can be formed by doping the layers with donor or acceptor materials using known techniques. Exemplary donor materials include nitrogen and phosphorus. Nitrogen is preferred donor material. Exemplary acceptor materials for doping SiC include boron and aluminum. Aluminum is a preferred acceptor material. The above materials are merely exemplary, however, and any acceptor and donor materials which can be doped into silicon carbide can be used. The doping levels and thicknesses of the various layers of self-aligned power SiC MESFET described herein can be varied to produce a device having desired characteristics for a particular application. Similarly, the dimensions of the various features of the device can also be varied to produce a device having desired characteristics for a particular application.

The SiC layers can be formed by epitaxial growth on a suitable substrate. The layers can be doped during epitaxial growth.

Exemplary doping concentration ranges for the SiC epitaxial layers of the device are as follows:
n-type source/drain: $>5\times10^{18}$ $cm^{-3}$;
n-type channel: $<1\times10^{17}$ $cm^{-3}$ (e.g., $<5\times10^{16}$ $cm^{-3}$);
optional n-type layer: $5\times10^{16}$ $cm^{-3}$-$3\times10^{17}$ $cm^{-3}$; and
p-type buffer: $1\times10^{15}$ $cm^{-3}$-$3\times10^{17}$ $cm^{-3}$ (e.g., $3\times10^{15}$ $cm^{-3}$-$3\times10^{17}$ $cm^{-3}$).

While the foregoing specifications teaches the principles of the present invention, with examples provided for the purpose of illustration, it will be appreciated by one skilled in the art from reading this disclosure that various changes in form and detail can be made without departing from the true score of the invention.

REFERENCES

[1] R. C. Clarke and John W. Palmour, "SiC Microwave Power Technologies," Proceedings of the IEEE, Vol. 90, No. 6, June 2002.

[2] K. Horio, Y. Fuseya, H. Kusuki, and H. Yanai, "Numerical Simulation of GaAs MESFET's with a p-Buffer Layer on the Semi-Insulating Substrate Compensated by Deep Traps," IEEE Transactions on Microwave Theory and Techniques, Vol. 37, No. 9, September 1989.

[3] N. Sghaier, J. M. Bluet, A. Souifi, G. Guilliot, E. Morvan and C. Brylinski, "Influce of Semi-Insulating Substrate Purity on the Output Characteristics of 4H—SiC MESFETs," Material Science Forum Vols. 389-393 (2002) pp.: 1363-1366.

[4] G. Y. Chung, C. C. Tin, J. R. Williams, K. McDonald, R. K. Chanana, Robert A. Weller, S. T. Pantelides, Leonard C. Feldman, O. W. Holland, M. K. Das, and John W. Palmour, "Improved Inversion Channel Mobility for 4H—SiC MOSFETs Following High Temperature Anneals in Nitric Oxide," IEEE Electron Device Letters, Vol. 22, No. 4, April 2001.

[5] Ho-Young Cha, C. I. Thomas, G. Koley, Lester F. Eastman, and Michael G. Spencer, "Reduced Trapping Effects and Improved Electrical Performance in buried-gate 4H—SiC MESFETs," IEEE Transactions on Electron Devices, Vol. 50, No. 7, July 2003.

[6] Allen, S. T., "Self-aligned field-effect transistor for high frequency applications," U.S. Pat. No. 5,686,737, Nov. 11, 1997.

[7] Pan et al, "Way to fabricate the self-aligned T-shape gate to reduce gate resistivity," U.S. Pat. No. 6,159,781, Dec. 12, 2000.

[8] Sriram et al, "Silicon Carbide Power MESFET with Surface Effect Suppressive Layer", U.S. Pat. No. 5,925,895, Jul. 20, 1999.

What is claimed is:

1. A semiconductor device comprising:
a SiC substrate layer;
a buffer layer of a p-type SiC on the SiC substrate layer;
a channel layer of n-type SiC on the buffer layer and having an upper surface opposite the buffer layer;
a recess in the upper surface of the channel layer, wherein the recess comprises a first sidewall, a second sidewall opposite the first sidewall and a bottom surface;
a source/drain layer of n-type SiC on the upper surface of the channel layer, wherein the source/drain layer is more heavily doped with an n-type dopant than the channel layer;
a source metal contact on the source/drain layer adjacent the first sidewall of the recess, the source metal contact having an edge adjacent the first sidewall;
a drain metal contact on the source/drain layer adjacent the second sidewall of the recess, the drain metal contact having an edge adjacent the second sidewall;
a Schottky metal on the bottom surface of the recess, wherein the Schottky metal has a first edge adjacent the first sidewall and a second edge adjacent the second sidewall; and
one or more layers of a dielectric material on the sidewalls of the recess;
wherein the Schottky metal forms a rectifying junction with the channel layer;
wherein the Schottky metal is aligned between the first and second sidewalls of the recess;
wherein there is no lateral spacing between the first edge of the Schottky metal and the edge of the source metal contact adjacent the first sidewall; and wherein there is no lateral spacing between the second edge of the Schottky metal and the edge of the drain metal contact adjacent the second sidewall.

2. The semiconductor device of claim 1, further comprising n-type SiC layer between the buffer layer and the channel layer, wherein the n-type SiC layer between the buffer layer and the channel layer is more heavily doped with an n-type dopant than the channel layer.

3. The semiconductor device of claim 2, wherein the SiC substrate is on a metal layer.

4. The semiconductor device of claim 1, wherein the buffer layer has a thickness of 0.1 to 10 µm and a doping concentration of $1\times10^{15}$ to $3\times10^{17}$.

5. The semiconductor device of claim 1, wherein the channel layer has a thickness of 1 to 5 µm and a doping concentration of $1\times10^{15}$ to $1\times10^{17}$.

6. The semiconductor device of claim 1, wherein the source/drain layer has a thickness of 0.2 to 1.5 µm and a doping concentration $>5\times10^{18}$.

7. The semiconductor device of claim 2, wherein the n-type SiC layer between the buffer layer and the channel layer has a thickness of 0.1 to 0.5 µm and a doping concentration of $5\times10^{16}$ to $3\times10^{17}$.

8. The semiconductor device of claim 1, wherein the one or more layers of a dielectric material on the sidewalls of the one or more recesses comprises a layer of $SiO_2$.

9. The semiconductor device of claim 1, wherein the one or more layers of a dielectric material on the sidewalls of the one or more recesses comprises a layer of $Si_3N_4$ on the sidewalls and a layer of $SiO_2$ on the layer of $Si_3N_4$.

10. The semiconductor device of claim 1, wherein the plurality of raised regions are elongate, and wherein the raised elongate regions are oriented parallel to one another.

11. The semiconductor device of claim 10, wherein the plurality of raised regions are spaced apart from one another at regular intervals.

12. The semiconductor device of claim 1, wherein the source/drain layer is epitaxially grown on the channel layer.

13. The semiconductor device of claim 1, wherein current flow from the source to the gate and from the gate to the drain occurs in the bulk material of the raised regions.

* * * * *